United States Patent
Bulatowicz et al.

(10) Patent No.: US 9,778,328 B2
(45) Date of Patent: Oct. 3, 2017

(54) OPTICAL PROBE BEAM STABILIZATION IN AN ATOMIC SENSOR SYSTEM

(71) Applicants: Michael D. Bulatowicz, Canoga Park, CA (US); Michael S. Larsen, Woodland Hills, CA (US)

(72) Inventors: Michael D. Bulatowicz, Canoga Park, CA (US); Michael S. Larsen, Woodland Hills, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 687 days.

(21) Appl. No.: 14/291,595

(22) Filed: May 30, 2014

(65) Prior Publication Data

US 2015/0346293 A1 Dec. 3, 2015

(51) Int. Cl.
*G01R 33/26* (2006.01)
*G01C 19/62* (2006.01)

(52) U.S. Cl.
CPC ............ *G01R 33/26* (2013.01); *G01C 19/62* (2013.01)

(58) Field of Classification Search
CPC ...... G01R 33/441; G01R 33/44; G01R 33/26; G01V 3/14; G01N 24/084; G01N 24/08; G01C 19/62; G01C 19/60; G04F 5/14; H01J 65/048

See application file for complete search history.

(56) References Cited

U.S. PATENT DOCUMENTS

| 5,293,414 A | 3/1994 | Ettinger et al. |
| 7,323,941 B1 | 1/2008 | Happer et al. |
| 7,359,059 B2 | 4/2008 | Lust et al. |
| 8,421,455 B1 | 4/2013 | Hovde et al. |

(Continued)

FOREIGN PATENT DOCUMENTS

| EP | 1 865 283 A1 | 12/2007 |
| JP | 2001-515213 A | 9/2001 |

(Continued)

OTHER PUBLICATIONS

Extended European Search Report for Application No. 15169193 dated Oct. 14, 2015.

(Continued)

*Primary Examiner* — Jermele M Hollington
*Assistant Examiner* — Suresh K Rajaputra
(74) *Attorney, Agent, or Firm* — Tarolli, Sundheim, Covell & Tummino LLP (57) ABSTRACT

One example embodiment includes an atomic sensor system. A probe laser generates a probe beam. A first portion of the probe beam is provided through a sensor cell comprising a first alkali vapor to calculate a measurable parameter of the system based on a first detection beam corresponding to the first portion of the probe beam exiting the sensor cell. A second portion of the probe beam can be provided through a stabilization cell that comprises a second vapor. A detection system can be configured to stabilize the frequency of the probe beam in a manner that is on-resonance with respect (Continued)

to an optical transition wavelength of the second alkali vapor and off-resonance with respect to an optical transition wavelength of the first alkali vapor based on a second detection beam corresponding to the second portion of the probe beam exiting the stabilization cell.

20 Claims, 3 Drawing Sheets

(56) References Cited

U.S. PATENT DOCUMENTS

| | | | |
|---|---|---|---|
| 2006/0083277 A1 | 4/2006 | Zhu et al. | |
| 2007/0266784 A1* | 11/2007 | Lust | G01C 19/62 73/504.05 |
| 2009/0289629 A1* | 11/2009 | Tuchman | G01R 33/032 324/304 |
| 2012/0112749 A1 | 5/2012 | Budker et al. | |
| 2012/0176130 A1 | 7/2012 | Ledbetter et al. | |
| 2013/0082701 A1 | 4/2013 | Mizutani et al. | |
| 2013/0265042 A1 | 10/2013 | Kawabata et al. | |

FOREIGN PATENT DOCUMENTS

| | | |
|---|---|---|
| JP | 2002539627 | 11/2002 |
| JP | 2006-115513 A | 4/2006 |
| JP | 2007-309915 A | 11/2007 |
| JP | 2009-236599 A | 10/2009 |
| JP | 2013-074999 A | 4/2013 |
| WO | 99/08766 A2 | 2/1999 |
| WO | 2013/150926 A1 | 10/2013 |

OTHER PUBLICATIONS

Anna L Marchant et al: "Off-resonance laser frequency stabilization using the Faraday effect", Optics Letters, Optical Society of America, US, vol. 36, No. 1, Jan. 1, 2011.

Kimball, et al.: "*A Dual-Isotope Rubidium Comagnetometer to Search for Anomalous Long-Range Spin-Mass (Spin-Gravity) Couplings of the Proton*"; found online at http://arxiv.org/pdf/1304.4660.pdf, submitted Apr. 17, 2013, pp. 1-13.

Decision of Refusal for Japanese Application No. 2015-110328 dated Nov. 8, 2016.

* cited by examiner

152
BEAM-SPLITTING THE OPTICAL PROBE BEAM INTO A FIRST PORTION OF THE OPTICAL PROBE BEAM AND A SECOND PORTION OF THE OPTICAL PROBE BEAM

154
PROVIDING THE FIRST PORTION OF THE OPTICAL PROBE BEAM THROUGH A SENSOR CELL OF THE ATOMIC SENSOR SYSTEM COMPRISING A FIRST VAPOR TO PROVIDE A FIRST DETECTION BEAM CORRESPONDING TO THE FIRST PORTION OF THE OPTICAL PROBE BEAM EXITING THE SENSOR CELL, THE FIRST VAPOR HAVING A FIRST OPTICAL TRANSITION WAVELENGTH

156
PROVIDING THE SECOND PORTION OF THE OPTICAL PROBE BEAM THROUGH A STABILIZATION CELL OF THE ATOMIC SENSOR SYSTEM COMPRISING A SECOND VAPOR TO PROVIDE A SECOND DETECTION BEAM CORRESPONDING TO THE SECOND PORTION OF THE OPTICAL PROBE BEAM EXITING THE STABILIZATION CELL, THE SECOND VAPOR HAVING A SECOND OPTICAL TRANSITION WAVELENGTH THAT IS UNEQUAL TO THE FIRST OPTICAL TRANSITION WAVELENGTH

158
MEASURING AN INTENSITY OF THE SECOND DETECTION BEAM

160
MAINTAINING THE FREQUENCY OF THE OPTICAL PROBE BEAM SUBSTANTIALLY ON-RESONANCE WITH THE SECOND OPTICAL TRANSITION WAVELENGTH BASED ON THE INTENSITY OF THE SECOND DETECTION BEAM

FIG. 4

OPTICAL PROBE BEAM STABILIZATION IN AN ATOMIC SENSOR SYSTEM

TECHNICAL FIELD

The present invention relates generally to sensor systems, and specifically to optical probe beam stabilization in an atomic sensor system.

BACKGROUND

Atomic sensors, such as nuclear magnetic resonance (NMR) gyroscopes and atomic magnetometers, employ optical beams to operate, such as to detect rotation about a sensitive axis or to detect the presence and magnitude of an external magnetic field. As an example, an NMR sensor system can employ a first optical beam as a pump beam. For example, the pump beam can be a circularly-polarized optical beam that is configured to spin-polarize a vapor, such as cesium (Cs) or rubidium (Rb), within a sealed cell of the sensor. The NMR sensor system can also employ a second optical beam as a probe beam. For example, the probe beam can be a linearly-polarized optical beam that is configured to indirectly detect precession of noble gas isotopes, such as xenon (Xe), based on the directly measured precession of the alkali metal, such as for detecting rotation of the detection system about the sensitive axis or detecting the magnitudes of the external magnetic field.

SUMMARY

One example embodiment includes an atomic sensor system. The system includes a probe laser configured to generate an optical probe beam having a probe frequency (i.e. wavelength). The system also includes a sensor cell comprising a first vapor. A first portion of the optical probe beam is provided through the sensor cell to facilitate measurement of a measurable parameter of the atomic sensor system based on a first detection beam corresponding to the first portion of the optical probe beam exiting the sensor cell. The system further includes a stabilization system comprising a detection system and a stabilization cell that comprises a second vapor. A second portion of the optical probe beam can be provided through the stabilization cell. The detection system can be configured to stabilize the probe frequency of the optical probe beam in a manner that is on-resonance with respect to an optical transition wavelength of the second vapor and off-resonance with respect to an optical transition wavelength of the first vapor based on a second detection beam corresponding to the second portion of the optical probe beam exiting the stabilization cell.

Another embodiment includes a method for stabilizing a frequency of an optical probe beam in an atomic sensor system. The method includes beam-splitting the optical probe beam into a first portion of the optical probe beam and a second portion of the optical probe beam. The method also includes providing the first portion of the optical probe beam through a sensor cell of the atomic sensor system comprising a first vapor to provide a first detection beam corresponding to the first portion of the optical probe beam exiting the sensor cell, the first vapor having a first optical transition wavelength. The method also includes providing the second portion of the optical probe beam through a stabilization cell of the atomic sensor system comprising a second vapor to provide a second detection beam corresponding to the second portion of the optical probe beam exiting the stabilization cell. The second vapor can have a second optical transition wavelength that is unequal to the first optical transition wavelength. The method also includes measuring an intensity of the second detection beam. The method further includes maintaining the frequency of the optical probe beam substantially on-resonance with the second optical transition wavelength based on the intensity of the second detection beam.

Another embodiment includes an atomic sensor system. The system includes a probe laser configured to generate an optical probe beam that is frequency modulated based on a modulation signal about a center frequency. The system also includes a sensor cell comprising a first vapor that is caused to precess. A first portion of the optical probe beam is provided through the sensor cell to facilitate measurement of a measurable parameter of the atomic sensor system based on a first detection beam corresponding to the first portion of the optical probe beam exiting the sensor cell. The system further includes a stabilization system. The stabilization system includes a stabilization cell that comprises a second vapor. A second portion of the optical probe beam is provided through the stabilization cell to provide a second detection beam corresponding to the second portion of the optical probe beam exiting the stabilization cell. The stabilization system also includes a photodetector system configured to generate an intensity signal corresponding to an intensity of the second detection beam. The stabilization system further includes a detection system configured to demodulate the intensity signal based on the modulation signal to maintain the center frequency of the optical probe at a frequency that is on-resonance with respect to an optical transition wavelength of the second vapor and off-resonance with respect to an optical transition wavelength of the first vapor.

DETAILED DESCRIPTION

The present invention relates generally to sensor systems, and specifically to optical probe beam stabilization in an atomic sensor system. The NMR sensor system can be implemented, for example, as an NMR gyroscope or atomic magnetometer. The NMR probe system includes a pump laser configured to generate an optical pump beam and a probe laser configured to generate an optical probe beam. The optical pump beam can be provided through a first vapor cell that is configured as a sensor cell, such as via beam optics, to stimulate an alkali metal vapor therein (e.g., to provide spin-polarization of the alkali metal vapor therein). The optical probe beam can be beam-split into a first portion and a second portion, and can have a wavelength that is tuned off-resonance from an optical transition wavelength associated with the alkali metal vapor in the sensor cell. The first portion of the optical probe beam is provided through the sensor cell, such as orthogonally relative to the optical pump beam, to measure a characteristic of the optical probe beam in response to polarization of the alkali metal vapor, which can be modulated in response to precession of noble gas isotopes based on the interaction of the alkali metal vapor with the noble gas isotopes. Thus, the optical probe beam can be implemented to measure rotation about a sensitive axis, in the example of the NMR gyroscope, or to measure a magnitude of an external magnetic field, in the example of the atomic magnetometer.

As an example, the optical probe beam can be modulated with a modulation signal about a center frequency, such that the center frequency can be tuned to the off-resonance frequency with respect to the optical transition wavelength associated with the vapor in the sensor cell. In addition, the sensor system can include a stabilization system that can be configured to stabilize the frequency of the optical probe beam. The stabilization system includes a second vapor cell that is configured as a stabilization cell through which the second portion of the optical probe beam is provided. The stabilization cell includes a vapor that can have a different optical transition wavelength relative to the vapor in the sensor cell. As an example, the vapor in the sensor cell and the stabilization cell can be different with respect to alkali metal vapor type, isotope, and/or concentration of buffer gases. Therefore, the stabilization system can ensure a stable frequency of the optical probe beam by tuning the frequency of the optical probe beam (e.g., the center frequency) substantially on-resonance with the optical transition wavelength of the vapor in the stabilization cell to provide a stable off-resonance frequency with respect to the optical transition wavelength of the vapor in the sensor cell. For example, the frequency of the second portion of the optical probe beam can be tuned to a frequency associated with a maximum absorption of the photons of the second optical probe beam, and thus on-resonance with the vapor therein, to ensure a stable frequency of the optical probe beam based on a feedback signal provided to the probe laser.

Figure 1:
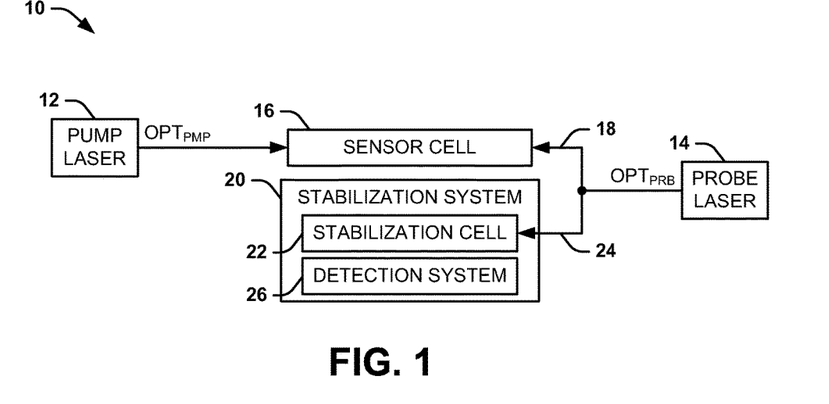
FIG. 1 illustrates an example of an atomic sensor system.

FIG. 1 illustrates an example of an atomic sensor system 10. The atomic sensor system 10 can correspond to any of a variety of NMR sensors, such as an NMR gyroscope that is configured to measure rotation about a sensitive axis or an atomic magnetometer that is configured to measure a magnitude of an externally provided magnetic field. The atomic sensor system 10 can thus be provided in any of a variety of applications, such as navigation and/or defense applications.

The atomic sensor system 10 includes a pump laser 12 configured to generate an optical pump beam $OPT_{PMP}$ and a probe laser 14 configured to generate an optical probe beam $OPT_{PRB}$. The optical pump beam $OPT_{PMP}$ can be, for example, circularly-polarized, and is provided through a sensor cell 16 that is configured as a first vapor cell that includes a vapor (e.g., an alkali metal vapor, such as rubidium (Rb) or cesium (Cs)). In the example of FIG. 1, a first portion of the optical probe beam $OPT_{PRB}$, demonstrated at 18, is likewise provided through the sensor cell 16, such as along an orthogonal axis with respect to the optical pump beam $OPT_{PMP}$. The first portion of the optical probe beam $OPT_{PRB}$ can be implemented, for example, for calculation of a measurable parameter associated with the atomic sensor system 10. For example, the first portion of the optical probe beam $OPT_{PRB}$ can be implemented to calculate a magnitude of an external magnetic field in the example of the atomic sensor system 10 being configured as an atomic magnetometer, or can be implemented to calculate rotation about a sensitive axis in the example of the atomic sensor system 10 being configured as an NMR gyroscope.

For example, the optical pump beam $OPT_{PMP}$ can be provided approximately parallel (e.g., collinearly) with a sensitive axis of the atomic sensor system 10. As an example, a magnetic field, such as generated by a magnetic field generator (not shown), can be provided though the sensor cell 16 along the axis with the optical pump beam $OPT_{PMP}$. Therefore, the optical pump beam $OPT_{PMP}$ and the magnetic field can stimulate precession of the vapor particles in the sensor cell 16 in a resonant condition to substantially amplify the modulation of the polarization vector of the vapor particles in the sensor cell 16 in response to magnetic fields applied orthogonally with respect to the optical pump beam $OPT_{PMP}$ (e.g., external orthogonal magnetic field components). The precession of the vapor particles in the sensor cell 16 can thus provide an indication of the measurable parameter associated with the atomic sensor system 10, such as in response to the first portion of the optical probe beam $OPT_{PRB}$ provided through the sensor cell 16. As an example, an output system (not shown) can monitor a Faraday rotation of a detection beam corresponding to the optical probe beam $OPT_{PRB}$ exiting the sensor cell 16, and can calculate the measurable parameter based on the Faraday rotation of the detection beam.

The atomic sensor system 10 also includes a stabilization system 20 that is configured to stabilize the frequency of the optical probe beam $OPT_{PRB}$, such as to substantially mitigate errors in the calculation of the measurable parameter that can result from frequency offsets of the optical probe beam $OPT_{PRB}$. As an example, it may be necessary to stabilize a frequency of the optical probe beam $OPT_{PRB}$ to a frequency that is off-resonance from an optical transition wavelength of the vapor in the sensor cell 16 to achieve optimally measurable Faraday rotation resulting from the external measurable parameter (e.g., an external magnetic field or rotation of the atomic sensor system 10 about a sensitive axis). However, changes in the wavelength of the optical probe beam $OPT_{PRB}$, as perceived by the associated output system, can be indistinguishable from changes in the external measurable parameter. As a result, instability in the wavelength of the optical probe beam $OPT_{PRB}$ can appear as changes in the external measurable parameter, thus resulting in errors in the measurement of the external measurable parameter. Accordingly, the stabilization system 20 can be configured to stabilize the frequency of the optical probe beam $OPT_{PRB}$ to a desired frequency, such as off-resonance with respect to the optical transition wavelength of the vapor in the sensor cell 16.

The stabilization system 20 includes a stabilization cell 22 that is configured as a second vapor cell that likewise includes a vapor (e.g., an alkali metal vapor), similar to the sensor cell 16. However, the vapor in the stabilization cell 22 can have an optical transition wavelength that is different relative to the optical transition wavelength of the vapor in sensor cell 16. For example, the sensor cell 16 can include a first isotope of an alkali metal (e.g., $^{85}Rb$) and the stabilization cell 22 can include second, different isotope of the same alkali metal (e.g., $^{87}Rb$). Alternatively, the sensor cell 16 and the stabilization cell 22 can include different alkali metals relative to each other. As another example, the sensor cell 16 can include a first buffer gas and the stabilization cell 22 can include a second buffer gas that can differ from the first buffer gas, such as by at least one of type and concentration. For example, the buffer gases can include any of a variety of combinations of nitrogen, helium-3, helium-4, xenon, neon, argon, krypton, or a variety of other types of buffer gases. In the example of different buffer gases, the sensor cell 16 and the stabilization system 20 can include the same or different isotopes of the same alkali metal.

In the example of FIG. 1, a second portion of the optical probe beam $OPT_{PRB}$, demonstrated at 24, is provided through the stabilization cell 22. The stabilization system 20 also includes a detection system 26 that is configured to monitor a detection beam associated with the second portion of the optical probe beam $OPT_{PRB}$ exiting the stabilization cell 22. For example, the detection system 26 can be configured to monitor an intensity of the detection beam. As a result of the different vapors in the sensor cell 16 and the stabilization cell 22, and thus the different optical transition wavelengths associated with the different vapors in the sensor cell 16 and the stabilization system 20, the stabilization system 20 can be configured to stabilize the frequency of the optical probe beam $OPT_{PRB}$ to a frequency that is substantially on-resonance with the optical transition wavelength of the vapor in the stabilization cell 22, such as based on the maintaining the wavelength of the optical probe beam $OPT_{PRB}$ at a wavelength associated with an absorption peak corresponding to a maximum absorption of the photons of the second portion of the optical probe beam $OPT_{PRB}$ by the vapor in the stabilization cell 22. Therefore, the optical probe beam $OPT_{PRB}$ can be maintained at a frequency that is substantially off-resonance with respect to the vapor in the sensor cell 16. Accordingly, the first portion of the optical probe beam $OPT_{PRB}$ can be provided through the sensor cell 16 at a stable wavelength for accurate calculation of the measurable parameter of the atomic sensor system 10.

Figure 2:
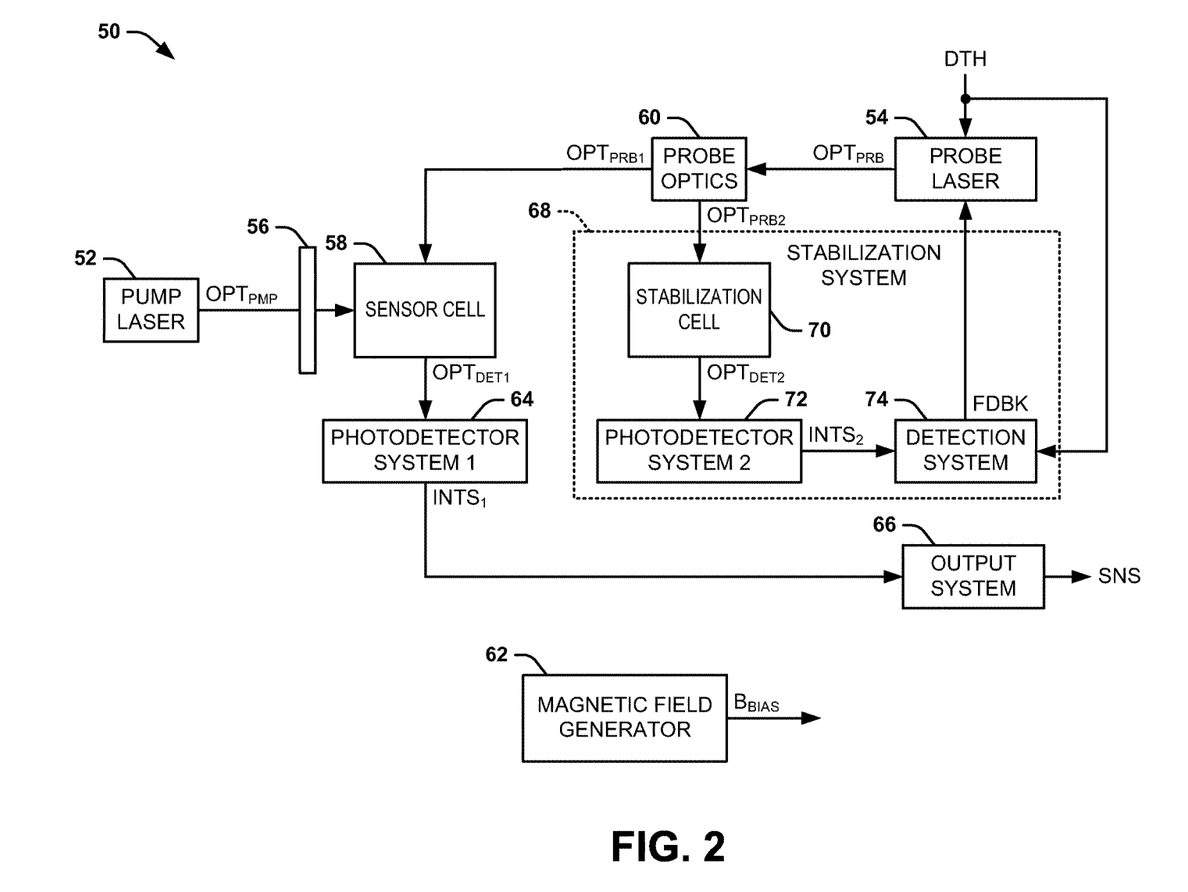
FIG. 2 illustrates another example of an atomic sensor system.

FIG. 2 illustrates another example of an atomic sensor system 50. The atomic sensor system 50 can correspond to any of a variety of NMR sensors, such as an NMR gyroscope that is configured to measure rotation about a sensitive axis or an atomic magnetometer that is configured to measure a magnitude of an externally provided magnetic field. The atomic sensor system 50 can thus be provided in any of a variety of applications, such as navigation and/or defense applications.

The atomic sensor system 50 includes a pump laser 52 configured to generate an optical pump beam $OPT_{PMP}$ and a probe laser 54 configured to generate an optical probe beam $OPT_{PRB}$. The optical pump beam $OPT_{PMP}$ is provided through a quarter-wave plate 56 that is configured to circularly polarize the optical pump beam $OPT_{PMP}$, such that the optical pump beam $OPT_{PMP}$ is provided through a sensor cell 58 that can be configured as a first vapor cell. The optical probe beam $OPT_{PRB}$ is provided to a set of probe optics 60 that is configured to split the optical probe beam $OPT_{PRB}$ into a first portion $OPT_{PRB1}$ and a second portion $OPT_{PRB2}$. In the example of FIG. 2, the optical pump beam $OPT_{PMP}$ and the first portion of the optical probe beam $OPT_{PRB1}$ are provided along orthogonal axes with respect to each other through the sensor cell 58, with the optical pump beam $OPT_{PMP}$ being provided approximately parallel (e.g., collinearly) with a sensitive axis of the atomic sensor system 50. The atomic sensor system 50 further includes a magnetic field generator 62 configured to generate a bias magnetic field $B_{BIAS}$ that is provided through the sensor cell 58 in a direction that is substantially parallel with the optical pump beam $OPT_{PMP}$. The bias magnetic field $B_{BIAS}$ can be configured to stimulate precession of particles (e.g., alkali metal atoms) of the vapor in the sensor cell 58 in a resonant condition to substantially amplify the modulation of the polarization vector of the vapor in the sensor cell 58 in response to magnetic fields applied orthogonally with respect to the optical pump beam $OPT_{PMP}$ (e.g., external orthogonal magnetic field components).

As an example, the sensor cell 58 can be configured as a sealed cell having a transparent or translucent casing that includes an alkali metal vapor (e.g., cesium (Cs) or rubidium (Rb)) and can include a noble gas isotope (e.g., argon (Ar) or xenon (Xe)). The wavelength of the optical pump beam $OPT_{PMP}$ can correspond to an emission line of the vapor in the sensor cell 58 (e.g., D1 or D2). The sensor cell 58 can thus comprise the operative physics portion of the atomic sensor system 50. Specifically, the optical pump beam $OPT_{PMP}$ can be provided through the sensor cell 58 to spin-polarize the vapor therein. As an example, noble gas isotopes within the sensor cell 58 can precess in the presence of the bias magnetic field $B_{BIAS}$, such that the spin-polarized vapor particles can have their spin-polarization modulated to result in a component of the net spin polarization being aligned with the precessing noble gas isotopes. The precession of the noble gas isotopes can thus be measured by a first detection beam $OPT_{DET1}$ corresponding to the first portion of the optical probe beam $OPT_{PRB1}$ exiting the sensor cell 58. As an example, the Faraday rotation of the linearly-polarized first detection beam $OPT_{DET1}$ exiting the sensor cell 58 can be determined based on a projection of the spin-polarization of the vapor in the sensor cell 58 along the axis orthogonal to the optical pump beam $OPT_{PMP}$. Accordingly, a rotation of the atomic sensor system 50, a magnitude of an external magnetic field, or a spin precession frequency or phase can be measured in response to determining the precession of the noble gas isotopes.

It is to be understood that, as described herein, the first portion of the optical probe beam $OPT_{PRB1}$ and the first detection beam $OPT_{DET1}$ correspond to the same optical beam. In the example of FIG. 2, the first portion of the optical probe beam $OPT_{PRB1}$ is provided to the sensor cell 58 and the first detection beam $OPT_{DET1}$ corresponds to the first portion of the optical probe beam $OPT_{PRB1}$ having exited the sensor cell 58, and thus has undergone a Faraday rotation. Therefore, as described herein, the first portion of the optical probe beam $OPT_{PRB1}$ and the first detection beam $OPT_{DET1}$ can be described interchangeably with respect to Faraday rotation. Specifically, the first portion of the optical probe beam $OPT_{PRB1}$ experiences Faraday rotation as it passes through the sensor cell 58, with such Faraday rotation being measured on the first detection beam $OPT_{DET1}$. The first detection beam $OPT_{DET1}$ thus also corresponds to the optical probe beam $OPT_{PRB}$ with respect to frequency (i.e., wavelength), in that the first portion of the optical probe beam $OPT_{PRB1}$ and the optical probe beam $OPT_{PRB}$ differ only in optical intensity and/or polarization.

In the example of FIG. 2, the atomic sensor system 50 includes a photodetector system 64 that is configured to generate a first intensity signal $INTS_1$ corresponding to a Faraday rotation of the first detection beam $OPT_{DET1}$. As an example, the photodetector system 64 can include a polarizing beam-splitter that is configured to separate the first detection beam $OPT_{DET1}$ into orthogonal polarizations, as well as a pair of photodetectors that are associated with the respective orthogonal polarizations. Therefore, the first intensity signal $INTS_1$ can be associated with a difference between the intensity of the orthogonal components of the first detection beam $OPT_{DET1}$, and thus to an associated Faraday rotation. The first intensity signal $INTS_1$ is provided to an output system 66 that is configured to calculate a measurable external parameter SNS of the atomic sensor system 50 based on the Faraday rotation of the first detection beam $OPT_{DET1}$, as determined by the first intensity signal $INTS_1$. For example, the measurable external parameter SNS can correspond to one or more of a rotation of the atomic sensor system 50, a magnitude of an external magnetic field, and a spin precession frequency or phase.

A change in the Faraday rotation of the first detection beam $OPT_{DET1}$ that is measured, as described previously, can result from the external parameter that is to be measured. However, the change in the Faraday rotation can also result from a change in the wavelength of the optical probe beam $OPT_{PRB}$. As an example, to optimize accuracy in the calculation of the measurable parameter, the optical probe beam $OPT_{PRB}$ can have a wavelength that is detuned (i.e., off-resonance) from an optical transition wavelength associated with the vapor in the sensor cell 58, such that the wavelength of the optical probe beam $OPT_{PRB}$ is shorter or longer than the wavelength associated with an absorption peak of the vapor in the sensor cell 58. However, environmental conditions (e.g., changes in temperature) and/or instability in electrical current excitation of the probe laser 54 can result in changes to the frequency (i.e., wavelength) of the optical probe beam $OPT_{PRB}$, which can affect the Faraday rotation per unit alkali polarization vector component parallel to the direction of propagation of the first detection beam $OPT_{DET1}$. Such effects on the Faraday rotation of the first detection beam $OPT_{DET}$ can be indistinguishable from Faraday rotation resulting from the external measurable parameter affecting the atomic sensor system 50, thus resulting in errors to the measurable external parameter SNS.

To stabilize the frequency of the optical probe beam $OPT_{PRB}$, the atomic sensor system 50 includes a stabilization system 68. The stabilization system 68 includes a stabilization cell 70 that is configured as a second vapor cell that, like the sensor cell 58, includes a vapor (e.g., an alkali metal vapor). However, similar to as described previously in the example of FIG. 1, the vapor in the stabilization cell 70 can have an optical transition wavelength that is different relative to the optical transition wavelength of the vapor in sensor cell 58. For example, the sensor cell 58 and the stabilization cell 70 can have different isotopes of the same alkali metal, and/or can include different types and/or concentrations of buffer gases. The second portion of the optical probe beam $OPT_{PRB2}$ is provided through the stabilization cell 70 to provide a second detection beam $OPT_{DET2}$ on a photodetector system 72. The photodetector system 72 generates a second intensity signal $INTS_2$ that is associated with an intensity of the second detection beam $OPT_{DET2}$. The stabilization system 68 further includes a detection system 74 that is configured to monitor the intensity of the second detection beam $OPT_{DET2}$ via the second intensity signal $INTS_2$. The detection system 74 can thus generate a feedback signal FDBK that is provided to the probe laser 54 to maintain the frequency of the optical probe beam $OPT_{PRB}$ at a predetermined frequency, such as on-resonance with respect to an optical transition wavelength associated with the vapor in the stabilization cell 70.

In the example of FIG. 2, the probe laser 54 is modulated with a modulation signal DTH. As an example, the modulation signal DTH can be modulated via a current that is provided in an active region of the probe laser 54 to generate the optical probe beam $OPT_{PRB}$. In the example of FIG. 2, the detection system 74 can be configured to demodulate the second intensity signal $INTS_2$ based on the modulation signal DTH (e.g., at the frequency of the modulation signal DTH). Therefore, the detection system 74 can provide the feedback signal FDBK to maintain the center frequency of the optical probe beam $OPT_{PRB}$ at the on-resonance frequency with respect to the optical transition wavelength associated with the vapor in the stabilization cell 70. The on-resonance frequency can correspond to a frequency associated with a wavelength associated with the absorption peak, with the absorption peak corresponding to a maximum absorption of the photons of the second portion of the optical probe beam $OPT_{PRB2}$ by the vapor in the stabilization cell 70.

As described previously, the sensor cell 58 and the stabilization cell 70 include different vapors, and thus the differing vapors have different optical transition wavelengths. Therefore, a given frequency that is on-resonance with respect to the optical transition wavelength associated with the vapor in the stabilization cell 70 is off-resonance with respect to the optical transition wavelength associated with the vapor in the sensor cell 58.

Figure 3:
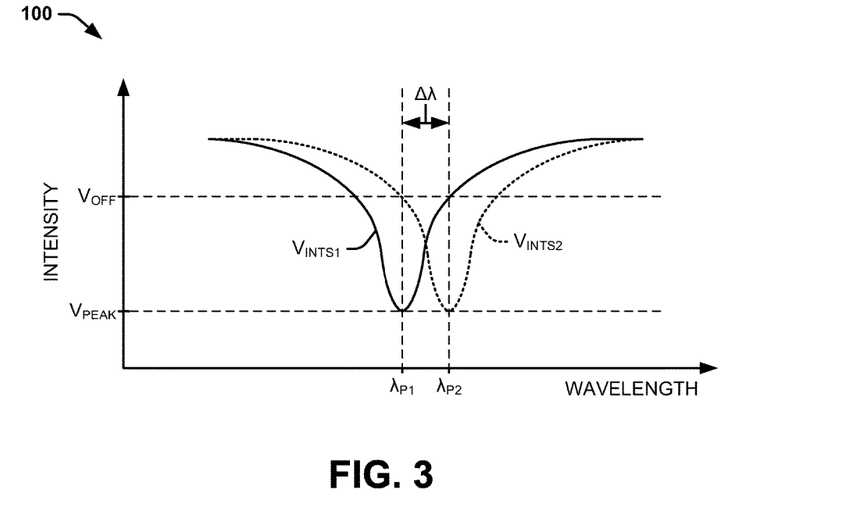
FIG. 3 illustrates an example of a graph of a wavelength of an optical probe beam relative to an intensity of an associated detection beam.

FIG. 3 illustrates an example of a graph 100 of a wavelength of the optical probe beam $OPT_{PRB}$ relative to an intensity of the associated detection beams $OPT_{DET1}$ and $OPT_{DET2}$. The graph 100 demonstrates a magnitude of intensity, as a function of voltage of the intensity signals $INTS_1$ and $INTS_2$, on the vertical axis in arbitrary units relative to a wavelength on the horizontal axis. In the example of FIG. 3, the graph 100 thus demonstrates a voltage $V_{INTS1}$ (solid line) of the first intensity signal $INTS_1$, as measured by the photodetector system 64 (e.g., as a sum of orthogonal photodetectors), and a voltage $V_{INTS2}$ (dashed line) of the second intensity signal $INTS_2$, as measured by the photodetector system 72. An inverse magnitude of the intensity of the first and second detection beams $OPT_{DET1}$ and $OPT_{DET2}$, as provided by the respective voltages $V_{INTS1}$ and $V_{INTS2}$ can thus correspond to absorption of the photons of the first and second portions of the optical probe beam $OPT_{PRB1}$ and $OPT_{PRB2}$ by the vapor in the respective sensor cell 58 and stabilization cell 70, such that lower values of the voltages $V_{INTS1}$ and $V_{INTS2}$ correspond to greater absorption of the photons of the first and second portions of the optical probe beam $OPT_{PRB1}$ and $OPT_{PRB2}$. Therefore, the lowest value of the intensity corresponds to an absorption peak of the absorption of the photons of the respective first and second portions of the optical probe beam $OPT_{PRB1}$ and $OPT_{PRB2}$ by the vapor in the respective sensor cell 58 and stabilization cell 70, demonstrated by a voltage $V_{PEAK}$. While the voltage $V_{PEAK}$ corresponds to an approximately equal voltage for the absorption peak of each of the voltages $V_{INTS1}$ and $V_{INTS2}$, it is to be understood that the intensity of the absorption peak of the voltages $V_{INTS1}$ and $V_{INTS2}$ may be different.

The graph 100 demonstrates a wavelength $\lambda_{P1}$ and a wavelength $\lambda_{P2}$ that correspond, respectively, to the optical transition wavelengths of the vapor in the sensor cell 58 and the stabilization cell 70. Thus, the detection system 74 can be configured to monitor the voltage $V_{INTS2}$, such as based on demodulating the second intensity signal $INTS_2$ via the modulation signal DTH, to generate the feedback signal FDBK. Thus, the feedback signal FDBK that is provided to the probe laser 54 can be configured to maintain the center frequency of the optical probe beam $OPT_{PRB}$ at the wavelength $\lambda_{P2}$, and thus on-resonance with the optical transition wavelength of the vapor in the stabilization cell 70. Because the vapors in the sensor cell 58 and the stabilization cell 70 have different optical transition wavelengths, the absorption peaks of the vapors in the sensor cell 58 and the stabilization cell 70 differ in wavelength by an amount demonstrated as $\Delta\lambda$. Therefore, upon maintaining the center frequency of the optical probe beam $OPT_{PRB}$ at the wavelength $\lambda_{P2}$ in a stable manner, the optical probe beam $OPT_{PRB}$ can be maintained on-resonance with the vapor in the stabilization cell 70 while being maintained off-resonance with the vapor in the sensor cell 58 in a stable manner, such that the photodetector system 64 can measure the first intensity signal $INTS_1$ at a voltage $V_{OFF}$, as demonstrated in the example of FIG. 3.

Accordingly, the frequency of the optical probe beam OPT$_{PRB}$ can be stabilized to substantially mitigate errors in the calculation of the measurable parameter SNS.

Figure 4:
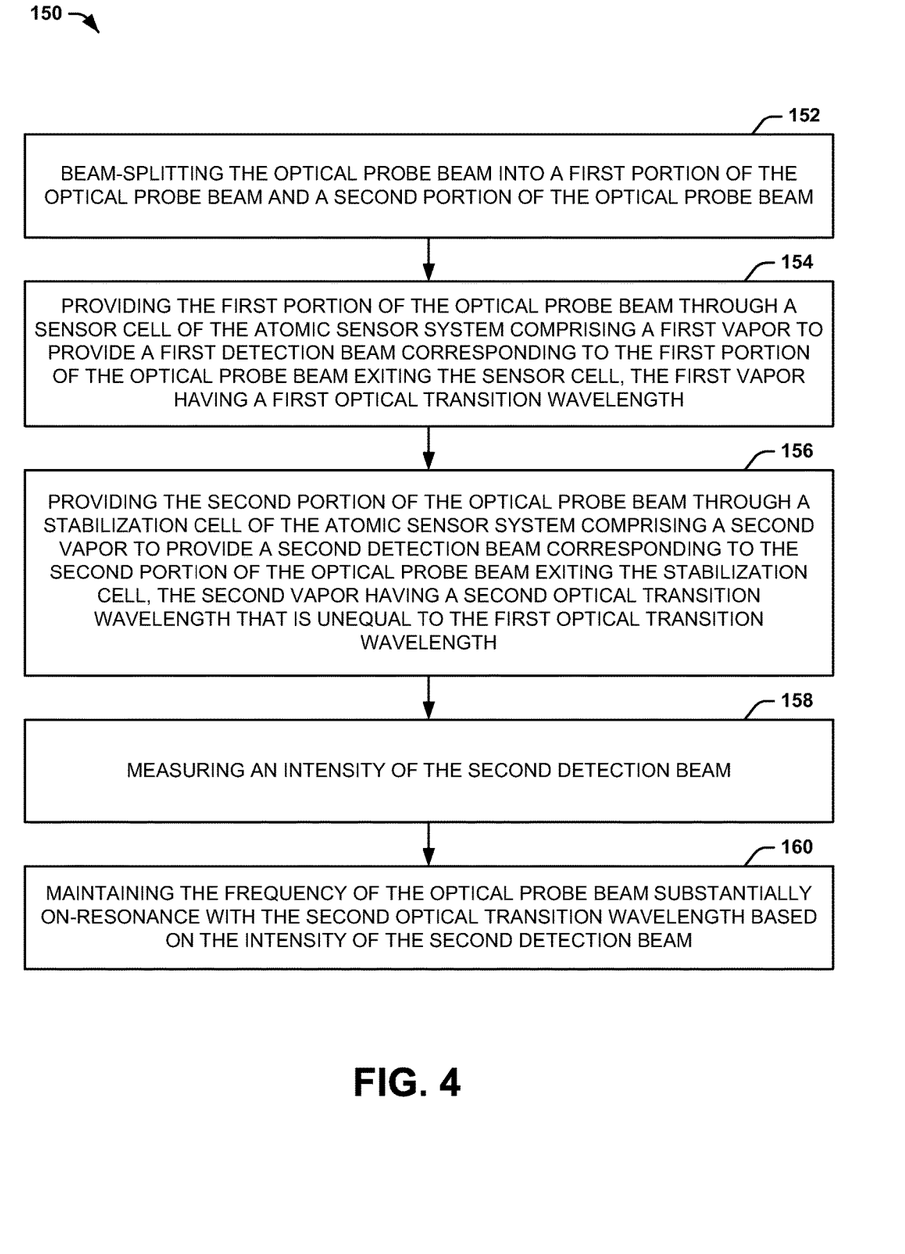
FIG. 4 illustrates an example of a method for stabilizing a frequency of an optical probe beam in an atomic sensor system.

In view of the foregoing structural and functional features described above, a methodology in accordance with various aspects of the present invention will be better appreciated with reference to FIG. 4. While, for purposes of simplicity of explanation, the methodology of FIG. 4 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 4 illustrates an example of a method 150 for stabilizing a frequency of an optical probe beam (e.g., the optical probe beam OPT$_{PRB}$) in an atomic sensor system (e.g., the atomic sensor system 10). At 152, the optical probe beam is beam-split into a first portion of the optical probe beam (e.g., the first portion OPT$_{PRB1}$) and a second portion of the optical probe beam (e.g., the second portion OPT$_{PRB2}$). At 154, the first portion of the optical probe beam is provided through a sensor cell (e.g., the sensor cell 16) of the atomic sensor system comprising a first vapor to provide a first detection beam (e.g., the first detection beam OPT$_{DET1}$) corresponding to the first portion of the optical probe beam exiting the sensor cell, the first vapor having a first optical transition wavelength (e.g., the wavelength $\lambda_{P1}$). At 156, the second portion of the optical probe beam is provided through a stabilization cell (e.g., the stabilization cell 22) of the atomic sensor system comprising a second vapor to provide a second detection beam (e.g., the second detection beam OPT$_{DET2}$) corresponding to the second portion of the optical probe beam exiting the stabilization cell, the second vapor having a second optical transition wavelength (e.g., the wavelength $\lambda_{P2}$) that is unequal to the first optical transition wavelength. At 158, an intensity of the second detection beam is measured. At 160, the frequency of the optical probe beam is maintained substantially on-resonance with the second optical transition wavelength based on the intensity of the second detection beam.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. An atomic sensor system comprising:
a probe laser configured to generate an optical probe beam having a probe frequency;
a sensor cell comprising a first vapor, wherein a first portion of the optical probe beam is provided through the sensor cell to facilitate measurement of a measurable parameter of the atomic sensor system based on a first detection beam corresponding to the first portion of the optical probe beam exiting the sensor cell; and
a stabilization system comprising a detection system and a stabilization cell that comprises a second vapor, a second portion of the optical probe beam being provided through the stabilization cell, the detection system being configured to stabilize the probe frequency of the optical probe beam in a manner that is on-resonance with respect to an optical transition wavelength of the second vapor and off-resonance with respect to an optical transition wavelength of the first vapor based on a second detection beam corresponding to the second portion of the optical probe beam exiting the stabilization cell.

2. The system of claim 1, wherein the first vapor comprises a first alkali metal isotope and wherein the second vapor comprises a second alkali metal isotope, such that the first vapor has a first optical transition wavelength and the second vapor has a second optical transition wavelength that is not equal to the first optical transition wavelength.

3. The system of claim 1, wherein the first vapor comprises a first buffer gas and wherein the second vapor comprises a second buffer gas, such that the first vapor has a first optical transition wavelength and the second vapor has a second optical transition wavelength that is not equal to the first optical transition wavelength.

4. The system of claim 3, wherein the first vapor comprises an alkali metal isotope, and wherein the second vapor comprises the alkali metal isotope, such that the first and second buffer gases are not equal with respect to at least one of type and concentration.

5. The system of claim 1, wherein the stabilization system is configured to stabilize the probe frequency based on maintaining the probe frequency at a frequency corresponding to an absorption peak associated with an approximate maximum absorption of the photons of the optical probe beam by the second vapor in the stabilization cell.

6. The system of claim 5, wherein the probe laser is configured to frequency-modulate the probe frequency about a center frequency, such that the detection system is configured to stabilize the center frequency based on maintaining the center frequency at a frequency corresponding to the absorption peak.

7. The system of claim 6, wherein the stabilization system comprises a photodetector system configured to generate an intensity signal corresponding to an intensity of the second detection beam, wherein the detection system is configured to demodulate the intensity signal based on a frequency associated with the frequency-modulation of the probe frequency to generate a feedback signal that is provided to the probe laser to maintain the center frequency at the frequency corresponding to the absorption peak.

8. The system of claim 1, further comprising:
a pump laser configured to generate an optical pump beam that is provided through the sensor cell along an axis that is orthogonal with respect to the first portion of the optical probe beam to spin-polarize particles of the first vapor; and
a magnetic field generator configured to generate a magnetic field along the axis to facilitate precession of the spin-polarized particles of the first vapor.

9. The system of claim 8, further comprising:
a photodetector system configured to generate an intensity signal corresponding to a Faraday rotation of the first detection beam; and
an output system configured to calculate the measurable parameter of the atomic sensor system based on the Faraday rotation of the first detection beam.

10. At least one of an NMR gyroscope system, an atomic magnetometer system, and an accelerometer system comprising the atomic sensor system of claim 1.

11. A method for stabilizing a frequency of an optical probe beam in an atomic sensor system, the method comprising:

beam-splitting the optical probe beam into a first portion of the optical probe beam and a second portion of the optical probe beam;

providing the first portion of the optical probe beam through a sensor cell of the atomic sensor system comprising a first vapor to provide a first detection beam corresponding to the first portion of the optical probe beam exiting the sensor cell, the first vapor having a first optical transition wavelength;

providing the second portion of the optical probe beam through a stabilization cell of the atomic sensor system comprising a second vapor to provide a second detection beam corresponding to the second portion of the optical probe beam exiting the stabilization cell, the second vapor having a second optical transition wavelength that is unequal to the first optical transition wavelength;

measuring an intensity of the second detection beam; and maintaining the frequency of the optical probe beam substantially on-resonance with the second optical transition wavelength based on the intensity of the second detection beam.

12. The method of claim 11, further comprising:

modulating the frequency of the optical probe beam about a center frequency based on a modulation signal;

demodulating the summation signal at a frequency of the modulation signal to generate a feedback signal, wherein maintaining the frequency of the optical probe beam comprises maintaining the center frequency of the optical probe beam substantially on-resonance with the second optical transition wavelength based on the feedback signal.

13. The method of claim 12, wherein stabilizing the center frequency of the optical probe beam comprises maintaining the center frequency of the optical probe beam at a frequency corresponding to a substantial maximum absorption of the optical probe beam by the vapor.

14. The method of claim 11, wherein the first vapor comprises a first isotope of an alkali metal and wherein the second vapor comprises a second isotope of the alkali metal.

15. The method of claim 11, wherein the first vapor comprises an alkali metal isotope, and wherein the second vapor comprises the alkali metal isotope, and wherein the first vapor comprises a first buffer gas and the second vapor comprises a second buffer gas, wherein the first and second buffer gases are not equal with respect to at least one of type and concentration.

16. An atomic sensor system comprising:

a probe laser configured to generate an optical probe beam that is frequency modulated based on a modulation signal about a center frequency;

a sensor cell comprising a first vapor that is caused to precess, wherein a first portion of the optical probe beam is provided through the sensor cell to facilitate measurement of a measurable parameter of the atomic sensor system based on a first detection beam corresponding to the first portion of the optical probe beam exiting the sensor cell; and a stabilization system comprising:
a stabilization cell that comprises a second vapor, a second portion of the optical probe beam being provided through the stabilization cell to provide a second detection beam corresponding to the second portion of the optical probe beam exiting the stabilization cell;
a photodetector system configured to generate an intensity signal corresponding to an intensity of the second detection beam; and
a detection system configured to demodulate the intensity signal based on the modulation signal to maintain the center frequency of the optical probe at a frequency that is on-resonance with respect to an optical transition wavelength of the second vapor and off-resonance with respect to an optical transition wavelength of the first vapor.

17. The system of claim 16, wherein the first vapor comprises a first isotope of an alkali metal and wherein the second vapor comprises a second isotope of the alkali metal.

18. The system of claim 16, wherein the first vapor comprises an alkali metal isotope, and wherein the second vapor comprises the alkali metal isotope, and wherein the first vapor comprises a first buffer gas and the second vapor comprises a second buffer gas, wherein the first and second buffer gases are not equal with respect to at least one of type and concentration.

19. The system of claim 16, further comprising:
a pump laser configured to generate an optical pump beam that is provided through the sensor cell along an axis that is orthogonal with respect to the first portion of the optical probe beam to spin-polarize particles of the first vapor; and
a magnetic field generator configured to generate a magnetic field along the axis to facilitate precession of the particles of the spin-polarized first vapor.

20. The system of claim 19, further comprising:
a photodetector system configured to generate an intensity signal corresponding to a Faraday rotation of the first detection beam; and
an output system configured to calculate the measurable parameter of the atomic sensor system based on the Faraday rotation of the first detection beam.

* * * * *